United States Patent
Yoo et al.

(10) Patent No.: US 7,772,760 B2
(45) Date of Patent: Aug. 10, 2010

(54) ACTIVE MATRIX ORGANIC LIGHT EMITTING DEVICE

(75) Inventors: Jeong-Geun Yoo, Yongin-si (KR); Jeong-No Lee, Yongin-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 959 days.

(21) Appl. No.: 10/930,948

(22) Filed: Sep. 1, 2004

(65) Prior Publication Data

US 2005/0062408 A1    Mar. 24, 2005

(30) Foreign Application Priority Data

Sep. 23, 2003   (KR) .................. 10-2003-0066038

(51) Int. Cl.
*H01J 63/04* (2006.01)
*H01J 1/62* (2006.01)

(52) U.S. Cl. .............. 313/504; 313/483; 313/498; 313/500; 313/505; 313/506; 313/1

(58) Field of Classification Search ............ 313/504, 313/500; 257/88
See application file for complete search history.

(56) References Cited

U.S. PATENT DOCUMENTS

| | | | | |
|---|---|---|---|---|
| 4,741,976 A * | 5/1988 | Eguchi et al. | ............... | 313/503 |
| 5,837,391 A * | 11/1998 | Utsugi | ............... | 313/504 |
| 5,917,280 A * | 6/1999 | Burrows et al. | ............... | 313/509 |
| 6,080,928 A * | 6/2000 | Nakagawa | ............... | 136/249 |
| 6,278,055 B1 * | 8/2001 | Forrest et al. | ............... | 136/263 |
| 6,337,492 B1 * | 1/2002 | Jones et al. | ............... | 313/503 |
| 6,689,492 B1 * | 2/2004 | Yamazaki et al. | ............... | 313/504 |
| 2002/0021096 A1 * | 2/2002 | Komiya | ............... | 315/169.1 |

FOREIGN PATENT DOCUMENTS

| | | |
|---|---|---|
| CN | 1440224 | 9/2003 |
| JP | 06310275 | 4/1994 |
| JP | 06151063 | 5/1994 |
| JP | 06-176870 | 6/1994 |
| JP | 7-176383 | 7/1995 |
| JP | 09-199276 | 7/1997 |
| JP | 10-199678 | 7/1998 |
| JP | 11-016677 | 1/1999 |
| JP | 2000-058260 | 2/2000 |
| JP | 2000228285 | 8/2000 |
| JP | 2001-511296 | 8/2001 |
| JP | 2002513503 | 5/2002 |
| JP | 2002-299054 | 10/2002 |
| JP | 2004031214 | 1/2004 |
| JP | 2004170487 | 6/2004 |
| JP | 2004-327248 | 11/2004 |
| JP | 2005-005223 | 1/2005 |
| WO | 2004-068911 | 8/2004 |

* cited by examiner

*Primary Examiner*—Nimeshkumar D. Patel
*Assistant Examiner*—Natalie K Walford
(74) *Attorney, Agent, or Firm*—H.C. Park & Associates, PLC

(57) ABSTRACT

An active matrix organic light emitting device having a structure where a plurality of emission layers having each separate current path are stacked. In the active matrix organic light emitting device of the present invention, a plurality of emission layers are stacked on an insulating substrate. A thin film transistor is formed on the insulating substrate and is connected in common with a number of electrode layers to independently drive the plurality of emission layers.

28 Claims, 3 Drawing Sheets

ACTIVE MATRIX ORGANIC LIGHT EMITTING DEVICE

CROSS-REFERENCE TO RELATED APPLICATION

This application claims the benefit of Korean Patent Application No. 2003-66038, filed Sep. 23, 2003, the disclosure of which is hereby incorporated herein by reference in its entirety.

BACKGROUND OF THE INVENTION

1. Field of the Invention

The present invention relates to an organic light emitting device and, more particularly, to a stacked active matrix organic light emitting device.

2. Description of the Related Art

Generally, an active matrix organic light emitting device has a plurality of pixels, each of which comprises an electroluminescent (EL) element and a thin film transistor that drives the EL element. In the EL element, red, green, and blue (R, G, and B) organic emission layers are interposed between an anode electrode and a cathode electrode to emit light from the respective organic emission layers based on the voltage applied to the anode electrode and the cathode electrode. The anode electrode is formed such that each R, G and B unit pixel is separated, and the cathode electrode is formed on the entire surface of the substrate.

Stacked organic light emitting devices (SOLEDs), in which a plurality of organic emission layers are stacked, have been described in the art. In SOLEDs, luminous efficiency per unit area can be enhanced by overlapping the organic emission layers within a pixel area.

The conventional SOLED has a structure in which an emission layer is provided n top of on an anode electrode and a cathode electrode is provided on top of on the emission layer. The anode electrode, the emission layer and the cathode electrode are typically sequentially repeated, such that there are several anode-emission layer-cathode groups stacked s on top of one another in the SOLED. A predetermined voltage is applied between the uppermost cathode electrode and the lowermost anode electrode. Because of the voltage applied between the uppermost cathode and the lowermost anode, a vertical current path is formed from the uppermost cathode to the lowermost anode such that current passes through all of the layers. Since light is emitted from several layers stacked on the substrate, the luminous efficiency per unit area is enhanced compared to the conventional organic light emitting device having a single emission layer.

However, in the conventional SOLED, the voltage applied between the uppermost cathode and the lowermost anode to form a single current path in a vertical direction is more than twice the voltage that would be applied in a display device having a single emission layer. Moreover, because a relatively high voltage is used, power consumption increases, and the characteristics of the thin film transistor that drives the EL element are degraded.

SUMMARY OF THE INVENTION

One aspect of the present invention provides an active matrix organic light emitting device. The light emitting device comprises a plurality of emission layers stacked on an insulating substrate. One or more first electrodes are formed between inner facing surfaces of two adjacent emission layers of the plurality of emission layers. A plurality of second electrodes is formed on respective outer surfaces of the two adjacent emission layers. The plurality of second electrodes are connected to each other. Another aspect of the present invention provides an active matrix organic light emitting device. The light emitting device comprises a plurality of emission layers stacked on an insulating substrate. One or more first electrodes are formed between inner facing surfaces of two adjacent emission layers of the plurality of emission layers. A plurality of second electrodes is formed on respective outer surfaces of the two adjacent emission layers. Each one of the plurality of emission layers each has a separate current path.

Another aspect of the invention provides an active matrix organic light emitting device. The device comprises a plurality of emission layers stacked on an insulating substrate. One or more first electrodes are formed between inner facing surfaces of two adjacent emission layers of the plurality of emission layers. A plurality of second electrodes is formed on outer surfaces of the two adjacent emission layers. A thin film transistor is formed on the insulating substrate. The thin film transistor is connected in common to the plurality of second electrodes to independently drive the plurality of emission layers.

An additional aspect of the invention provides an active matrix organic light emitting device. In the light emitting device, a thin film transistor is formed on an insulating substrate. A first insulating layer is formed on the insulating substrate so that it covers the thin film transistor. The first insulating layer has a first contact hole exposing a portion of the thin film transistor. A first electrode is connected to the thin film transistor through the first contact hole. A second insulating layer has a first opening that exposes a portion of the first electrode. A first emission layer is formed on the first electrode within the first opening. A second electrode is formed over the entire surface of the substrate and has an isolation pattern. A third insulating layer is formed on the second insulating layer and has a second opening that exposes a portion of the second electrode corresponding to the first emission layer, and a second contact hole that exposes a portion of the first electrode corresponding to the isolation pattern. A second emission layer is formed on the exposed portion of the second electrode. A third electrode is formed on the third insulating layer to connect the first electrode through the second contact hole.

Yet another aspect of the invention provides an active matrix organic light emitting device. The light emitting device comprises a plurality of emission layers stacked on an insulating substrate. Each one of plurality of first electrodes is formed on one surface of a corresponding one of the plurality of emission layers. Each one of a plurality of second electrodes is formed on another surface of the corresponding one of the plurality of emission layers. An insulating layer is formed between adjacent ones of the plurality of first electrodes and the plurality of second electrodes. The plurality of first electrodes are connected to each other, and are adapted to have a first voltage applied to them. The plurality of second electrodes are connected to each other and are adapted to have a second voltage applied to them, so that ones of the plurality of emission layers connected between the first electrode and the second electrode each have separate current paths.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
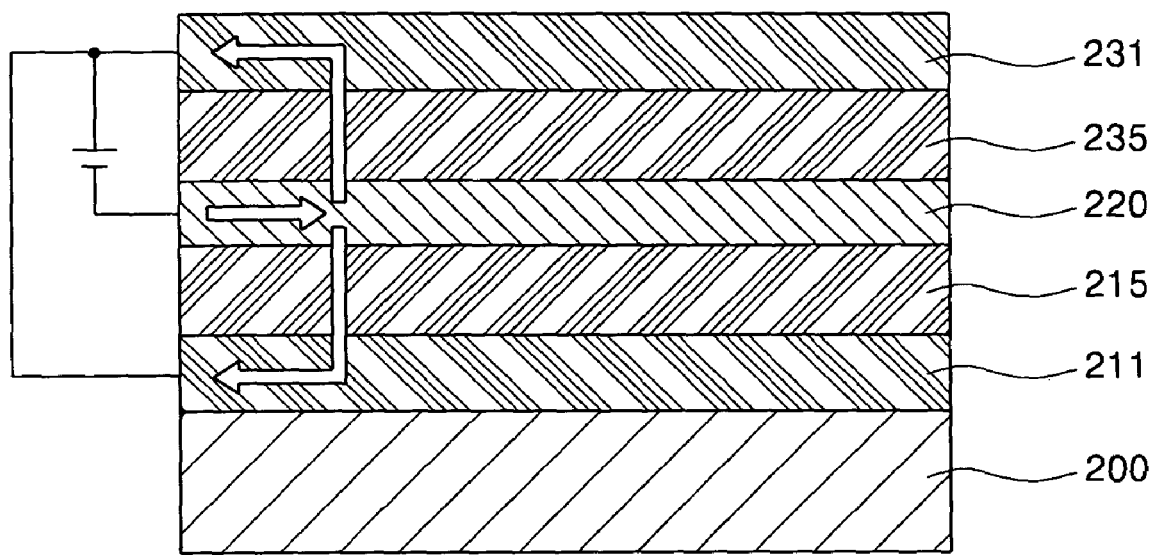
FIG. 1 is a cross-sectional view of an active matrix organic light emitting device according to a first embodiment of the present invention.

The present invention will now be described more fully with reference to the accompanying drawings, in which certain embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout the specification.

FIG. 1 is a cross-sectional view of a stacked active matrix organic light emitting device according to a first embodiment of the present invention, illustrating a cross-sectional structure of one stacked organic light emitting device.

As shown in FIG. 1, a stacked organic light emitting device according to an embodiment of the invention has a structure in which a plurality of emission layers, in this case, two emission layers 215 and 235, are formed on an insulating substrate 200. That is, a cathode electrode 220 is formed as a common electrode between one surface of the emission layer 215 and one surface of the emission layer 235 facing the first surface of the emission layer 215. Each of the anode electrodes 211 and 231 is formed on one of the opposite surfaces of the two emission layers 215 and 235. The first and second anode electrodes 211 and 231 are connected to each other, so that the same level of voltage is simultaneously applied to each. A predetermined voltage is applied between the first and second anodes 211 and 231 and the cathode electrode 220.

Therefore, the first anode electrode 211, the first emission layer 215 and the cathode electrode 220, stacked sequentially, constitute one light emitting device, and the cathode electrode 220, the second emission layer 235 and the second anode electrode 231, stacked sequentially, constitute another light emitting device.

In the stacked active matrix organic light emitting device described above, the cathode electrode 220 is used as a common electrode, and a predetermined voltage is applied to the cathode electrode 220 and its lower first anode electrode 211, and at the same time, the predetermined voltage is applied to the cathode electrode 220 and its upper second anode electrode 231.

Therefore, the first emission layer 215 formed between the cathode electrode 220 and the first anode electrode 211 and the second emission layer 235 formed between the cathode electrode 220 and the second anode electrode 231 are simultaneously and independently driven, so that the first and second emission layers 215 and 235 each form two different current paths as indicated by the arrow of FIG. 1.

Therefore, the stacked first emission layer 215 and second emission layer 235 are independently driven by the same level voltage, thereby enhancing luminous efficiency per unit area without increasing a driving voltage, as compared with the conventional single emission layer display device.

According to a first embodiment of the present invention, when the cathode electrode 220 is formed of a transparent electrode material, and the first anode electrode 211 and the second anode electrode 231 are formed of opaque electrode material and transparent electrode material, respectively, the stacked active matrix organic light emitting device has a top emission structure in which light is emitted from the first emission layer 215 and the second emission layer 235 so that it radiates away from the substrate 200.

When the cathode electrode 220 is formed of transparent electrode material, and the first anode electrode 211 and the second anode electrode 231 are formed of transparent electrode material and opaque electrode material, respectively, the stacked active matrix organic light emitting device has a bottom emission structure in which the light is emitted from the first emission layer 215 and the second emission layer 235 so that it radiates toward the substrate 200.

Furthermore, when the cathode electrode 220 is formed of transparent electrode material, and both the first anode electrode 211 and the second anode electrode 231 are formed of transparent electrode materials, the stacked active matrix organic light emitting device has a double-sided emission structure in which the light is emitted from the first emission layer 215 and the second emission layer 235 so that it radiates both toward and away from the substrate 200.

However, when the cathode electrode 220 is formed of an opaque electrode material, and both the first electrode 211 and the second electrode 231 are formed of transparent electrode materials, the stacked active matrix organic light emitting device has a structure in which light is emitted by the first emission layer 215 and the second emission layer 235 so that it radiates in opposite directions. Specifically, light from the first emission layer 215 is emitted so that it radiates in the substrate direction, and light from the second emission layer 235 is emitted so that it radiates away from the substrate.

Figure 2:
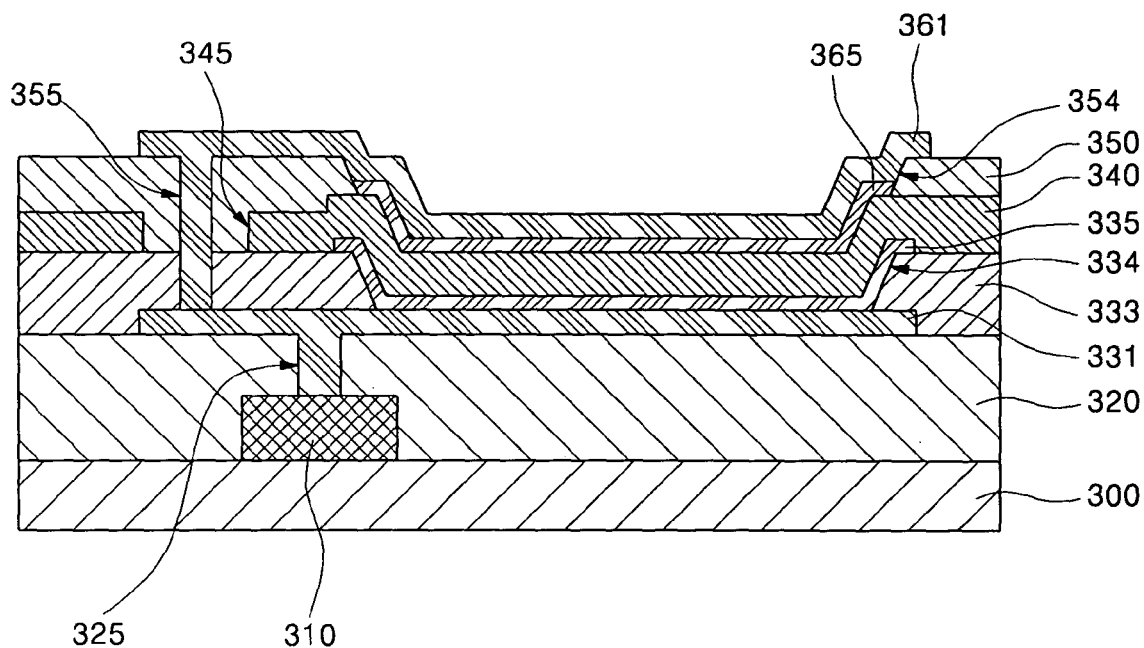
FIG. 2 is a cross-sectional view of a stacked organic light emitting device illustrating a method for connecting a plurality of anode electrodes driving a plurality of organic emission layers, for the active matrix organic light emitting device according to a first embodiment of the present invention.

FIG. 2 is a cross-sectional view of a stacked organic light emitting diode illustrating a method for connecting a plurality of anode electrodes to one thin film transistor to simultaneously drive a plurality of organic emission layers, for the stacked active matrix organic light emitting device according to a first embodiment of the present invention.

As shown in FIG. 2, a planarization layer 320 is formed on an insulating substrate 300, below which a thin film transistor 310 has been formed. (The thin film transistor 310 is shown schematically in FIG. 2.) The planarization layer 320 and is etched to form a via hole 325 that exposes a portion of the thin film transistor 310. For example, the via hole 325 may expose a portion of a drain electrode the thin film transistor 310.

Electrode material is again deposited on the substrate, and then is etched to form a second anode electrode 361 which is electrically connected to the first anode electrode 331 through the contact hole 355. Since the second anode electrode 361 is connected to the first anode electrode 331 through the contact hole 355 and is formed to have a width narrower than the isolation pattern 345, the second anode electrode 361 and the cathode electrode 340 are electrically isolated by the isolation pattern 345. A second organic emission layer 365 is formed on the second anode electrode 361 within opening 354.

A planarization layer 350 is formed on the substrate, and is then etched to form an opening 354 that exposes the cathode electrode 340 on the first organic emission layer 335. At the same time, the planarization layer 350 and the pixel defining layer 333 are etched to form a contact hole 355 that exposes a portion of the first anode electrode 331. The contact hole 355 is formed in the isolation pattern 345 of the cathode electrode 340 such that it has a width narrower than the isolation pattern 345.

Electrode material is again deposited on the substrate, and then is etched to form a second anode electrode 361 which is electrically connected to the first anode electrode 331 through the contact hole 355. Since the second anode electrode 361 is connected to the first anode electrode 331 through the contact hole 355 and is formed to have a width narrower than the isolation pattern 345, the second anode electrode 361 and the cathode electrode 340 are electrically isolated by the isolation pattern 345. A second organic emission layer 365 is formed on the second anode electrode 361 within opening 354.

The isolation pattern 345 is formed in an engraved pattern, such as engraved grooves or stripes, within the cathode electrode 340, so that the isolation pattern 345 prevents the second anode electrode 361 from electrically connecting with the cathode electrode 340.

Figure 3:
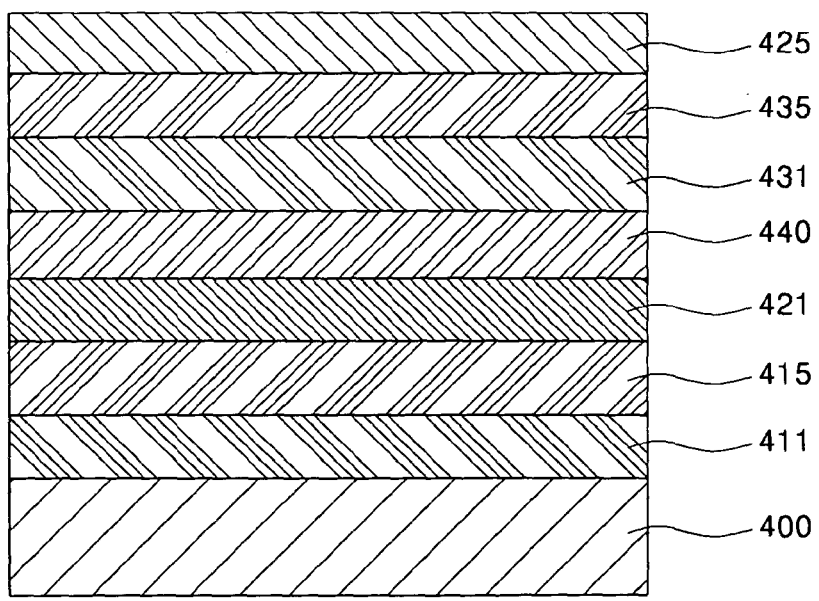
FIG. 3 is a cross-sectional view of an active matrix organic light emitting device according to a second embodiment of the present invention.

FIG. 3 is a cross-sectional structure of a stacked organic light emitting device according to a second embodiment of the present invention. As shown in FIG. 3, the stacked organic light emitting device is formed to have a structure in which a plurality of emission layers, such as two emission layers 415 and 435, are stacked on an insulating substrate 400. Specifically, of the two emission layers 415 and 435, the first emission layer 415 is formed between a first anode electrode 411 and a first cathode electrode 421, and a second emission layer 435 is formed between a second anode electrode 431 and a second cathode electrode 425. The first and second anode electrodes 411 and 431 are connected to each other, and the same level of anode voltage is simultaneously applied to them. Similarly, the first and second cathode electrodes 421 and 425 are connected to each other, and the same level of cathode voltage is simultaneously applied to them. Therefore, predetermined voltages are applied between the anode electrodes 411 and 431 and the cathode electrodes 421 and 425, which are formed on both surfaces of the first and second emission layers 415 and 435.

Therefore, the first anode electrode 411, the first emission layer 415 and the first cathode electrode 421, sequentially stacked, constitute one light emitting device, and the second anode electrode 431, the second emission layer 435 and the second cathode electrode 425, sequentially stacked, constitute another light emitting device. These stacked light emitting devices are isolated with each other by a transparent insulating layer 440.

In the stacked organic light emitting device according to the second embodiment, since the same voltage is simultaneously applied between the first anode electrode 411 and the first cathode electrode 421, and between the second anode electrode 431 and the second cathode electrode 425, the first emission layer 415 and the second emission layer 435 are each driven by the same independent voltage.

Therefore, since the first emission layer 415, formed between the first cathode electrode 421 and the first anode electrode 411, and the second emission layer 435, formed between the second cathode electrode 425 and the second anode electrode 431, are simultaneously and independently driven, the first and second emission layers 415 and 435 each form two different current paths as shown in the first embodiment of FIG. 1.

Therefore, the stacked first emission layer 415 and second emission layer 435 are independently driven by the same level of voltage, thereby enhancing luminous efficiency per unit area without increasing the driving voltage, as compared with a conventional display device that has a single emission layer.

Additionally, in the case of the second embodiment of the present invention, the first cathode electrode 421 and the second cathode electrode 425 are each formed of transparent electrode material, and the first anode electrode and the second anode electrode are formed of opaque electrode material and transparent electrode material, respectively. Therefore, the stacked active matrix organic light emitting device has a top emitting structure in which light from the first and second emission layers 415, 435 is emitted so that it radiates away from the substrate 400.

When the first and second cathode electrodes 421 and 425 are formed of transparent electrode material, and the first anode electrode 411 and the second anode electrode 431 are formed of transparent electrode material and opaque electrode material, respectively, the stacked active matrix organic light emitting device has a bottom emitting structure in which the light from the first and second emission layers 415 and 435 is emitted so that it radiates toward the substrate 400.

Furthermore, when the first and second cathode electrodes 421 and 425 are formed of transparent electrode materials, and the first anode electrode 411 and the second anode electrode 431 are formed of transparent electrode materials, the stacked active matrix organic light emitting device has a double-sided emission structure in which the light from the first and second emission layers 415 and 435 is emitted so that it radiates both toward and away from the substrate.

Additionally, when the first cathode electrode 421 and the second anode electrode 431 are formed of opaque electrode material, and the first anode electrode 411 and the second cathode electrode 425 are formed of transparent electrode material, the stacked active matrix organic light emitting device has a structure in which the light is emitted so that it radiates in opposite directions. Specifically, light from the first emission layer 415 is emitted so that it radiates toward the substrate, and the light from the second emission layer 435 is emitted so that it radiates away from the substrate.

Figure 4:
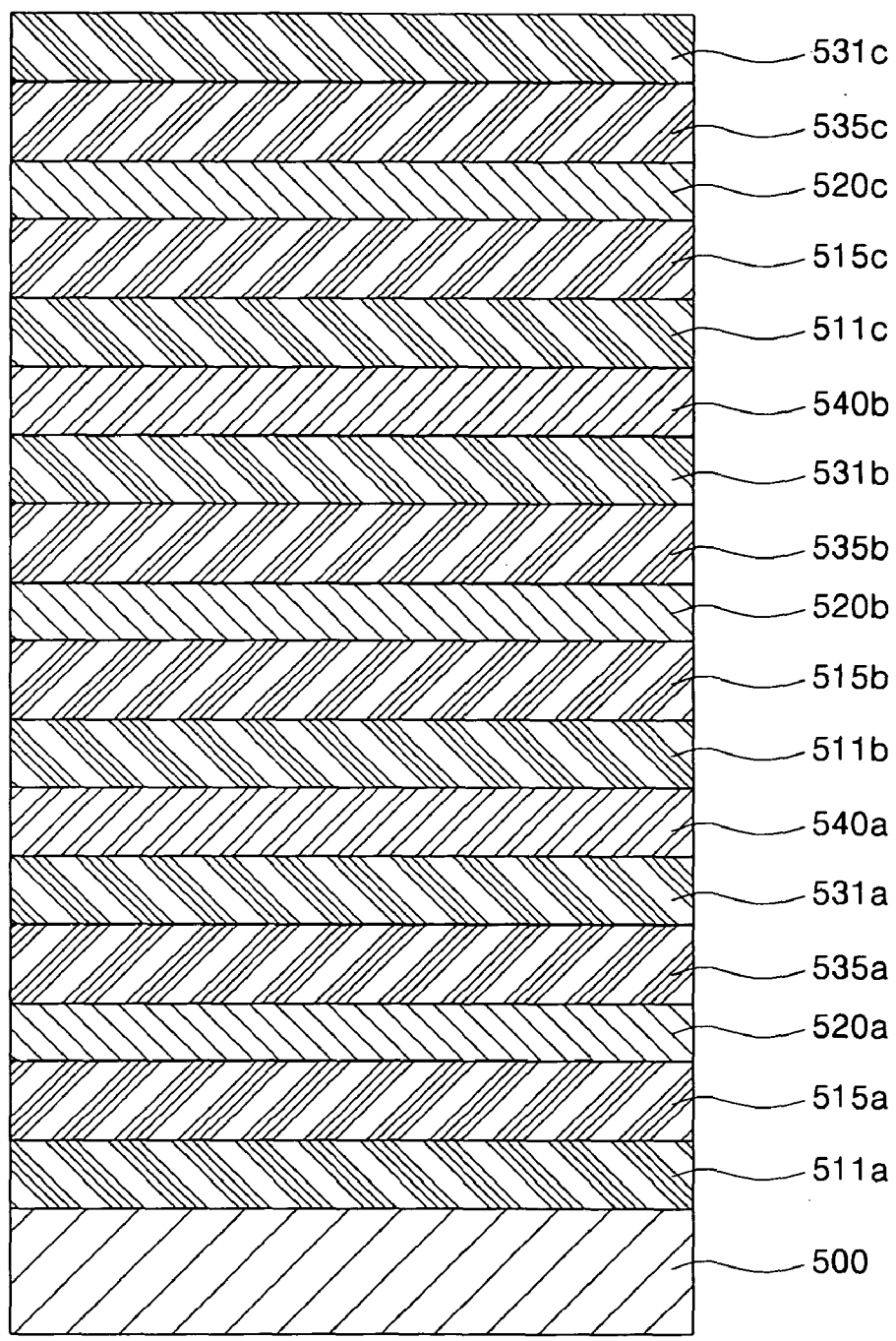
FIG. 4 is a cross-sectional view of an active matrix organic light emitting device according to a third embodiment of the present invention.

FIG. 4 is a cross-sectional structure of a stacked active matrix organic light emitting device according to a third embodiment of the present invention, which is the three-layered stacked organic light emitting device. As shown in FIG. 4, three stacked organic light emitting devices are stacked and formed on an insulating substrate 500. Each of the organic light emitting devices has a stacked structure as shown in FIG. 1, and each stacked organic light emitting device is formed such that it can be independently driven by interposing an insulating layer therebetween.

More particularly, a first stacked organic light emitting device having an anode electrode 511a, an emission layer 515a, a cathode electrode 520a, an emission layer 535a and an anode electrode 531a are formed on a substrate 500. A second stacked organic light emitting device having an anode electrode 511b, an emission layer 515b, a cathode electrode 520b, an emission layer 535b and an anode electrode 531b are formed on a first insulating layer 540a. Additionally, a third stacked organic light emitting device having an anode electrode 511c, an emission layer 515c, a cathode electrode 520c, an emission layer 535c and an anode electrode 531c are formed on a second insulating layer 540b.

In the stacked organic light emitting device according to the third embodiment, in each stacked organic light emitting device, the anode electrodes (511a, 531a), (511b, 531b) and (511c, 531c) are connected to each other as shown in FIG. 1, and the predetermined anode voltage is simultaneously applied to them. The cathode electrodes 520a, 520b and 520c are also connected in common, and the cathode voltage is applied to them. In each stacked organic light emitting device, the anode electrodes (511a, 531a), (511b, 531b) and (511c, 531c) are connected to each other in the configuration shown in FIG. 2. Therefore, each stacked organic light emitting device has a current path separate from the current paths of the other stacked organic light emitting devices.

In the third embodiment, in each stacked organic light emitting device, the anode electrodes (511a, 531a), (511b, 531b) and (511c, 531c) can be connected to each other as shown in FIG. 1, and either the same anode voltage or a different anode voltage can be simultaneously applied. Either the same cathode voltage or a different cathode voltage can be applied to the cathode electrodes, (520a), (520b) and (520c). Therefore, when the emission layers (515a, 535a), (515b, 535b) and (515c, 535c) in each stacked organic light emitting device implement the same color, or R, G and B colors, respectively, the light emitting efficiency can be enhanced and the R, G and B colors can be optimized.

Additionally, in the third embodiment, when the anode electrode and the cathode electrode are formed of transparent electrode material or opaque electrode material, the type and direction of the light emitted from the emission layer can be varied as in the first and second embodiments. Moreover, the thin film transistor can be connected as in the first embodiment.

According to the embodiments of the present invention, while each stacked organic light emitting device isolated by the insulating layer is illustrated as having a structure in which two emission layers are stacked, it can be also applied to a structure in which a plurality of emission layers are stacked.

While in the embodiments of the present invention, the engraved isolation pattern is formed in the cathode electrode to prevent the electrical connection with the anode electrode, a variety of methods for electrically isolating the cathode electrode and the anode electrode can also be applied. Furthermore, while the anode electrode and the cathode electrode are formed in a single layer, they can be formed in stacked layers to improve the electrode characteristics.

In the organic light emitting device according to the embodiments of the present invention as described above, the anode electrodes are connected to each other such that a plurality of emission layers each have a separate current path, thereby enhancing the luminous efficiency per unit area without increasing a driving voltage.

While certain embodiments of the present invention are described above, those skilled in the art will appreciate that a variety of changes and modifications can be made without departing from the spirit and the scope of the present invention, as described in the following claims.

What is claimed is:

1. An active matrix organic light emitting device, comprising:
   a plurality of emission layers stacked on an insulating substrate;
   one or more first electrodes formed between respective inner facing surfaces of two adjacent emission layers among the plurality of emission layers, the one or more first electrodes being electrically connected to both of the two adjacent emission layers; and
   a plurality of second electrodes each formed on respective outer surfaces of the two adjacent emission layers;
   wherein the plurality of second electrodes are connected to each other.

2. The active matrix organic light emitting device of claim 1, wherein the one or more first electrodes act as common electrodes for the two adjacent emission layers.

3. The active matrix organic light emitting device of claim 1, wherein the one or more first electrodes act as cathode electrodes, and the plurality of second electrodes act as anode electrodes.

4. The active matrix organic light emitting device of claim 1, wherein the first electrode is opaque and the plurality of second electrodes are transparent, such that light from the two adjacent emission layers is emitted so that it radiates in opposite directions.

5. The active matrix organic light emitting device of claim 1, wherein:
   the first electrode is transparent;
   a second electrode, of the plurality of second electrodes, that is formed below a lowest emission layer of the plurality of emission layers is opaque; and
   others of the plurality of second electrodes are transparent, such that light from the two adjacent emission layers is emitted so that it radiates away from the substrate.

6. The active matrix organic light emitting device of claim 1, wherein:
   the first electrode is transparent; and
   a second electrode, of the plurality of second electrodes, that is formed over an uppermost emission layer of the plurality of emission layers is opaque; and
   others of the plurality of second electrodes are transparent, such that light from the two adjacent emission layers is emitted such that it radiates toward the substrate.

7. The active matrix organic light emitting device of claim 1, wherein:
   the first electrode is transparent; and
   each one of the plurality of second electrodes is transparent, such that light from the two adjacent emission layers of the plurality of emission layers is emitted so that it radiates in directions toward and away from the substrate.

8. The active matrix organic light emitting device of claim 1, wherein an insulating layer is interposed between two adjacent second electrodes of the plurality of second electrodes to insulate the two adjacent second electrodes.

9. An active matrix organic light emitting device comprising:
   a plurality of emission layers stacked on an insulating substrate;
   one or more first electrodes formed between respective facing surfaces of two adjacent emission layers among the plurality of emission layers; and
   a plurality of second electrodes formed on respective outer surfaces of the two adjacent emission layers;
   wherein each one of the plurality of emission layers has a separate current path and wherein the plurality of second electrodes are connected to each other, and
   wherein the one or more first electrodes are electrically connected to both of the two adjacent emission layers.

10. The active matrix organic light emitting device of claim 9, wherein:
    the first electrode is a cathode electrode acting as a common electrode for the two adjacent emission layers; and
    the plurality of second electrodes act as an anode electrodes for each one of the plurality of emission layers.

11. The active matrix organic light emitting device of claim 9, wherein:
    the plurality of second electrodes are connected to each other and are adapted to have the same level of voltage applied to them; and each of the plurality of emission layers is independently driven to emit light in accordance with the voltage applied to the one or more first electrodes and the plurality of second electrodes.

12. The active matrix organic light emitting device of claim 9, wherein:
the one or more first electrodes are opaque; and
each of the plurality of second electrodes is transparent, so that light from the two adjacent emission layers is emitted in opposite directions.

13. The active matrix organic light emitting device of claim 9, wherein:
the one or more first electrodes are transparent;
a second electrode, of the plurality of second electrodes, formed below a lowest emission layer of the plurality of emission layers is opaque, and others of the plurality of second electrodes are transparent ones, so that light from the two adjacent emission layers is emitted so that it radiates away from the substrate.

14. The active matrix organic light emitting device of claim 9, wherein:
the one or more first electrodes are transparent;
a second electrode, of the plurality of second electrodes, formed over an uppermost emission layer of the plurality of emission layers is opaque; and
others of the plurality of second electrodes are transparent, such that light from the two adjacent emission layers is emitted so that it radiates toward the substrate.

15. The active matrix organic light emitting device of claim 9, wherein:
the one or more first electrodes are transparent; and
each one of the plurality of second electrodes is transparent, such that light from the two adjacent emission layers is emitted so that it radiates toward and away from the substrate.

16. An active matrix organic light emitting device comprising:
a plurality of emission layers stacked on an insulating substrate;
one or more first electrodes formed between inner facing surfaces of two adjacent emission layers of the plurality of emission layers;
a plurality of second electrodes formed on respective outer surfaces of the two adjacent emission layers; and
a thin film transistor formed on the insulating substrate, wherein the thin film transistor is connected in common to the plurality of second electrodes to drive the plurality of emission layers independently, and
wherein the one or more first electrodes are electrically connected to both of the two adjacent emission layers.

17. The active matrix organic light emitting device of claim 16, wherein the one or more first electrodes act as cathode electrodes and the plurality of second electrodes act as anode electrodes.

18. The active matrix organic light emitting device of claim 16, wherein:
when the one or more first electrodes are opaque and the plurality of second electrodes are transparent, light from the two adjacent emission layers is emitted in opposite directions; and
when the one or more first electrodes are transparent, and the plurality of second electrodes are all transparent ones, light from the two adjacent emission layers is emitted so that it radiates toward and away from the substrate.

19. The active matrix organic light emitting device of claim 16, wherein:
when the one or more first electrodes are transparent, and a second electrode, of the plurality of second electrodes, formed below a lowest emission layer of the plurality of emission layers is opaque, and others of the plurality of second electrodes are transparent, light from the two adjacent emission layers is emitted so that it radiates away from the substrate; and
when the one or more first electrodes are transparent, and a second electrode, of the plurality of second electrodes, formed over the uppermost emission layer of the plurality of emission layers is opaque, and others of the plurality second electrodes are transparent, light from the two adjacent emission layers is emitted so that it radiates toward the substrate.

20. An active matrix organic light emitting device comprising:
a thin film transistor formed on an insulating substrate;
a first insulating layer formed on the insulating substrate covering the thin film transistor, and having a first contact hole exposing a portion of the thin film transistor;
a first electrode connected to the thin film transistor through the first contact hole;
a second insulating layer having a first opening exposing a portion of the first electrode;
a first emission layer formed on the first electrode within the first opening;
a second electrode formed on an entire surface of the substrate and having an isolation pattern;
a third insulating layer formed on the second insulating layer and having a second opening exposing a portion of the second electrode corresponding to the first opening, and a second contact hole exposing a portion of the first electrode corresponding to the isolation pattern;
a second emission layer formed on the exposed portion of the second electrode; and
a third electrode formed on the third insulating layer and connected to the first electrode through the second contact hole.

21. The active matrix organic light emitting device of claim 20, wherein the first electrode a cathode acting as a common electrode for the first and second emission layers, and the second and third electrodes are anodes, to which the same level of voltage is applied.

22. The active matrix organic light emitting device of claim 20, wherein the first and third insulating layers are planarization layers and the second insulating layer is a pixel defining layer.

23. The active matrix organic light emitting device of claim 20, wherein the isolation pattern is formed in an engraved pattern of grooves or stripes.

24. The active matrix organic light emitting device of claim 20, wherein:
when the first electrode is opaque and the second and third electrodes are transparent, light from the first emission layer and the second emission layer is emitted in opposite directions;
when the first and second electrodes are transparent and the third electrode is opaque, the light from the first and second emission layers is emitted so that it radiates toward the substrate; and
when the first and third electrodes are transparent and the second electrode is opaque, the light from the first and second emission layers is emitted so that it radiates away from the substrate.

25. An active matrix organic light emitting device comprising:

a plurality of emission layers stacked on an insulating substrate;

one or more first electrodes formed between respective inner facing surfaces of two adjacent emission layers among the plurality of emission layers, the one or more first electrodes being electrically connected to both of the two adjacent emission layers;

a plurality of second electrodes each formed on respective outer surfaces of the two adjacent emission layers; and an insulating layer formed between adjacent ones of the plurality of second electrodes;

wherein the plurality of first electrodes are connected to each other and receive a first voltage, and the plurality of second electrodes are connected to each other and receive a second voltage, such that ones of the plurality of emission layers connected between the first electrode and the second electrode each have separate current paths.

26. The active matrix organic light emitting device of claim 25, wherein each of the plurality of first electrodes acts as a cathode electrode and each of the plurality of second electrodes acts as an anode electrode.

27. The active matrix organic light emitting device of claim 25, wherein:

when the plurality of first electrodes is opaque and the plurality of second electrodes is transparent ones, light from the two adjacent emission layers is emitted in opposite directions; and when the plurality of first electrodes is transparent, and the plurality of second electrodes is transparent, the light from the two adjacent emission layers is emitted so that it radiates toward and away from the substrate.

28. The active matrix organic light emitting device of claim 25, wherein:

when the plurality of first electrodes is transparent and a second electrode, of the plurality of second electrodes, formed below a lowest emission layer of the plurality of emission layers opaque, and others of the plurality of second electrodes are transparent, light from the two adjacent emission layers is emitted so that it radiates away from the substrate; and when the plurality of first electrodes is transparent, and a second electrode, of the plurality of second electrodes, formed over an uppermost emission layer of the plurality of emission layers is opaque, and others of the plurality of second electrodes are transparent, light from the two adjacent emission layers is emitted so that it radiates toward the substrate.

\* \* \* \* \*